(12) United States Patent
Fujiwara et al.

(10) Patent No.: US 10,756,647 B2
(45) Date of Patent: Aug. 25, 2020

(54) POWER CONVERTER DEVICE HAVING A CAPACITOR AND A REACTOR ADJACENT TO EACH OTHER ON THE SAME CIRCUIT BOARD

(71) Applicant: DAIKIN INDUSTRIES, LTD., Osaka-shi, Osaka (JP)

(72) Inventors: Masahide Fujiwara, Osaka (JP); Nobuyasu Hiraoka, Osaka (JP); Keito Kotera, Osaka (JP); Shinichi Ishizeki, Osaka (JP)

(73) Assignee: DAIKIN INDUSTRIES, LTD., Osaka-Shi (JP)

( * ) Notice: Subject to any disclaimer, the term of this patent is extended or adjusted under 35 U.S.C. 154(b) by 0 days.

(21) Appl. No.: 16/480,144

(22) PCT Filed: Jan. 22, 2018

(86) PCT No.: PCT/JP2018/001813
§ 371 (c)(1),
(2) Date: Jul. 23, 2019

(87) PCT Pub. No.: WO2018/159153
PCT Pub. Date: Sep. 7, 2018

(65) Prior Publication Data
US 2019/0341860 A1    Nov. 7, 2019

(30) Foreign Application Priority Data

Mar. 2, 2017    (JP) .................................. 2017-039199

(51) Int. Cl.
*H02M 7/538* (2007.01)
*H02M 7/5387* (2007.01)
(Continued)

(52) U.S. Cl.
CPC ......... *H02M 7/5387* (2013.01); *F25B 31/006* (2013.01); *H02M 1/14* (2013.01);
(Continued)

(58) Field of Classification Search
CPC ...... H02M 1/14; H02M 5/4585; H02M 7/003; H02M 7/06
See application file for complete search history.

(56) References Cited

U.S. PATENT DOCUMENTS 5,905,647 A * 5/1999 Shirai ................ H05K 7/20909
363/141
9,998,054 B1 * 6/2018 Yohanan ............... H02P 27/047
(Continued)

FOREIGN PATENT DOCUMENTS

JP    7-327376 A    12/1995
JP    2010-110065 A    5/2010
(Continued)

*Primary Examiner* — Yusef A Ahmed
(74) *Attorney, Agent, or Firm* — Birch, Stewart, Kolasch & Birch, LLP

(57) ABSTRACT

A power converter includes: a converter circuit converting an alternating current to a direct current; a reactor electrically connected to one of output terminals of the converter circuit; a capacitor electrically connected to the other output terminal of the converter circuit and the reactor; and an inverter circuit electrically connected to the capacitor converting the direct current to an alternating current. The capacitor is a film capacitor. The capacitor and the reactor are mounted on an identical circuit board.

4 Claims, 4 Drawing Sheets

(51) Int. Cl.
*F25B 31/00* (2006.01)
*H02M 1/14* (2006.01)
*H02M 5/458* (2006.01)
*H02M 7/06* (2006.01)
*H02P 27/06* (2006.01)

(52) U.S. Cl.
CPC .......... *H02M 5/4585* (2013.01); *H02M 7/06* (2013.01); *H02P 27/06* (2013.01)

(56) References Cited

U.S. PATENT DOCUMENTS

| | | | |
|---|---|---|---|
| 2003/0155893 A1* | 8/2003 | Schreiber | H02J 3/38 322/12 |
| 2005/0057210 A1* | 3/2005 | Ueda | H02M 5/458 318/801 |
| 2009/0009091 A1* | 1/2009 | Morimoto | H01J 61/327 315/119 |
| 2009/0140680 A1* | 6/2009 | Park | H02P 23/26 318/438 |
| 2010/0014988 A1* | 1/2010 | Tsutsui | F04B 35/04 417/44.1 |
| 2011/0026227 A1* | 2/2011 | Monster | H02K 11/022 361/710 |
| 2011/0249421 A1 | 10/2011 | Matsuo et al. | |
| 2014/0313806 A1* | 10/2014 | Shinohara | H05K 7/20927 363/141 |
| 2015/0114021 A1* | 4/2015 | Oguri | H01L 23/473 62/259.2 |
| 2015/0128631 A1* | 5/2015 | Oguri | F24F 1/22 62/259.2 |
| 2015/0195957 A1* | 7/2015 | Ohoka | H05K 7/20927 361/702 |
| 2015/0271953 A1* | 9/2015 | Fujiwara | H05K 7/20254 165/80.4 |
| 2016/0118924 A1* | 4/2016 | Ishizeki | H02P 27/04 318/400.3 |
| 2016/0302330 A1* | 10/2016 | Hamari | H05K 7/206 |
| 2016/0330876 A1* | 11/2016 | Fujiwara | F25B 31/006 |
| 2016/0359438 A1* | 12/2016 | Taoka | H02P 1/029 |
| 2017/0190027 A1* | 7/2017 | Koizumi | B25B 21/00 |
| 2018/0007785 A1* | 1/2018 | Kamikura | H02M 5/458 |
| 2018/0099372 A1* | 4/2018 | Takeda | B24B 23/02 |
| 2018/0175752 A1* | 6/2018 | Takeoka | F25B 49/02 |
| 2018/0187905 A1* | 7/2018 | Doi | F25D 31/00 |
| 2018/0191240 A1* | 7/2018 | Doi | H02M 1/34 |
| 2018/0226911 A1* | 8/2018 | Yagi | H02P 29/62 |
| 2018/0367059 A1* | 12/2018 | Tsukano | F24F 1/24 |

FOREIGN PATENT DOCUMENTS

| | | |
|---|---|---|
| JP | 2013-224785 A | 10/2013 |
| JP | 2016-111746 A | 6/2016 |
| JP | 2017-28825 A | 2/2017 |
| WO | WO 2014/034564 A1 | 3/2014 |

* cited by examiner

POWER CONVERTER DEVICE HAVING A CAPACITOR AND A REACTOR ADJACENT TO EACH OTHER ON THE SAME CIRCUIT BOARD

TECHNICAL FIELD

The present invention relates to a power converter.

BACKGROUND ART

An apparatus such as an air conditioner has a power converter to drive a motor. In many cases, a power converter includes, e.g., a converter circuit and an inverter circuit (see, for example, Patent Document 1). Such a power converter is often provided with a reactor at the output of the converter circuit to reduce, e.g., a harmonic current.

CITATION LIST

Patent Document

Patent Document 1: Japanese Unexamined Patent Publication No. 2013-224785

SUMMARY OF THE INVENTION

Technical Problem

In the example of the above-mentioned patent document, the reactor is not provided on a printed circuit board. Therefore, the reactor needs to be connected to the printed circuit board via wiring, which may require some countermeasures against noise. Specifically, a ferrite core and/or a snubber circuit may sometimes need to be installed. This means that the apparatus of the prior art may increase in cost and size. On the other hand, the reactor is a relatively large component, and cannot be easily mounted on a printed circuit board.

In view of the foregoing disadvantages, the present invention has been achieved to arrange a power converter including a converter circuit and an inverter circuit in a smaller layout area.

Solution to the Problem

In order to solve the above problems, a first aspect of the present invention is directed to a power converter including: a converter circuit (11) converting an alternating current to a direct current; a reactor (L) electrically connected to one of output terminals of the converter circuit (11); a capacitor (12) electrically connected to the other output terminal of the converter circuit (11) and the reactor (L); and an inverter circuit (13) electrically connected to the capacitor (12) and converts the direct current to an alternating current, wherein the capacitor (12) is a film capacitor, and the capacitor (12) and the reactor (L) are mounted on an identical circuit board (20).

In this configuration, use of the film capacitor can downsize the capacitor (12), and as a result, the reactor (L) can be easily mounted on the circuit board (20). Therefore, countermeasures against noise (the addition of a snubber circuit or a ferrite core), which have been required in the prior art in connecting the reactor outside the circuit board and the circuit board to each other via wiring, is no longer necessary.

A second aspect is an embodiment of the first aspect. In the second aspect, the converter circuit (11), the capacitor (12), the reactor (L), and the inverter circuit (13) are mounted on the circuit board (20) in a two-stage grid, the converter circuit (11) and the reactor (L) are mounted on an identical stage of the grid, the inverter circuit (13) and the capacitor (12) are mounted on a stage different from a stage on which the converter circuit (11) is mounted in the grid, and the converter circuit (11) and the inverter circuit (13) are adjacent to each other, and the reactor (L) and the capacitor (12) are adjacent to each other, in the grid.

This configuration can simplify the wiring connecting the converter circuit (11), the capacitor (12), the inverter circuit (13), and the reactor (L).

A third aspect is an embodiment of the first or second aspect. In the third aspect, the capacitor (12) and the reactor (L) form a resonant circuit, whose resonant frequency is set such that a ripple current component included in the direct current outputted from the converter circuit (11) passes through the resonant circuit, and a current component having a same frequency as a carrier frequency of the inverter circuit (13) is attenuated.

In a power converter using a capacitor having a relatively small capacity as the capacitor (12), this configuration no longer requires countermeasures against noise (the addition of a snubber circuit or a ferrite core), which have been required in the prior art in connecting the reactor outside the circuit board and the circuit board to each other via wiring.

A fourth aspect is an embodiment of any one of the first to the third aspects. In the fourth aspect, the power converter further includes a radiator (50) which cools the converter circuit (11) and the inverter circuit (13) using a refrigerant flowing through a refrigerant circuit (120) performing a refrigeration cycle.

This configuration allows the refrigerant in the refrigerant circuit (120) to cool the converter circuit (11) and the inverter circuit (13).

A fifth aspect is an embodiment of the second aspect. In the fifth aspect, the power converter further includes: a radiator (50) which cools the converter circuit (11) and the inverter circuit (13) using a refrigerant flowing through a refrigerant circuit (120) performing a refrigeration cycle; and a noise filter member (60) disposed to precede the converter circuit (11), wherein the radiator (50) is disposed between the noise filter member (60) and the reactor (L).

This configuration allows the noise filter member (60) to be disposed on the same stage of the grid on which the converter circuit (11) and the reactor (L) are mounted.

Advantages of the Invention

According to the first aspect, the power converter can be arranged in a smaller layout area.

Further, the converter circuit, the capacitor, the inverter circuit, and the reactor arranged according to the second aspect can contribute to the reduction in the layout area of the power converter.

Further, the third aspect can provide a power converter having a capacitor of a relatively small capacity with the above-described advantages.

Further, the fourth aspect can provide a power converter using a refrigerant to cool a converter circuit and an inverter circuit with the above-described advantages.

According to the fifth aspect, the pattern of traces from the noise filter member to the reactor can be simplified.

DESCRIPTION OF EMBODIMENTS

Embodiments of the present invention will be described in detail below with reference to the drawings. The embodiments below are merely exemplary ones in nature, and are not intended to limit the scope, applications, or use of the invention.

Embodiment of Invention

Figure 1:
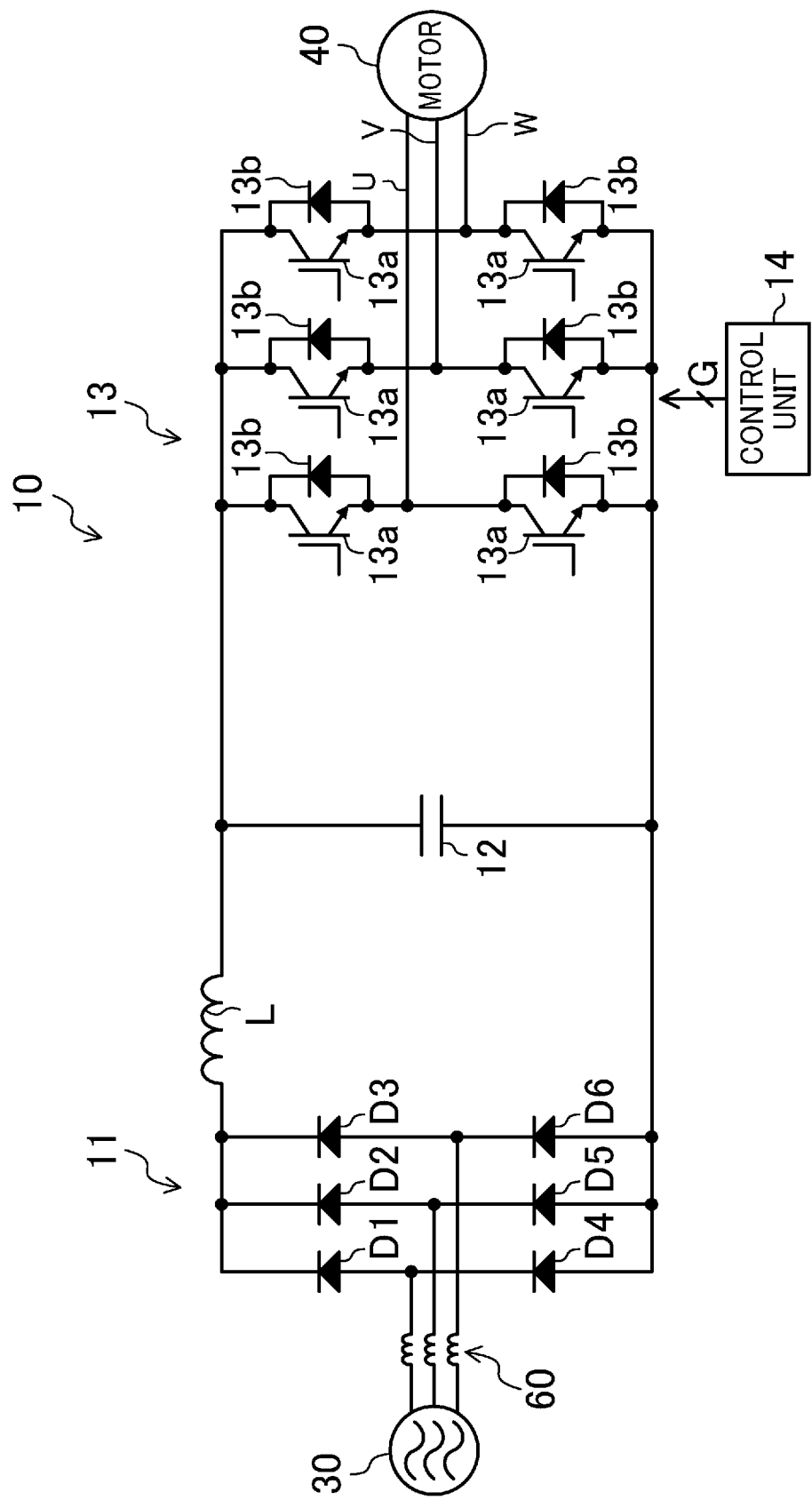
FIG. 1 is a block diagram illustrating an exemplary configuration for a power converter according to an embodiment of the present invention.

FIG. 1 is a block diagram illustrating an exemplary configuration for a power converter (10) according to an embodiment of the present invention. The power converter (10) includes a converter circuit (11), a capacitor (12), a reactor (L), and a control unit (14). A three-phase alternating current (AC) power source (30) (e.g., a commercial three-phase AC power source) is connected to the power converter (10). The power converter (10) converts a current outputted from the AC power source (30) to a three-phase alternating current, and supplies it to a motor (40) that is a load. In this example, the motor (40) is incorporated in a compressor (121) provided for a refrigerant circuit (120) of an air conditioner (100), which will be described later. The motor (40) drives a compression mechanism provided for the compressor (121). In this example, an interior permanent magnet (abbreviated as IPM) motor is employed as the motor (40).

The converter circuit (11) includes six diodes (D1 to D6) bridge-connected to each other, and performs full-wave rectification of the alternating current inputted from the AC power source (30). In this example, the converter circuit (11) is connected to the AC power source (30) via a common mode coil (60). That is to say, the common mode coil (60) is provided to precede the converter circuit (11). The common mode coil (60) is provided to reduce common mode noise, and is an example of a noise filter member of the present invention. The common mode coil (60) of three phases is wound around one ferrite core. That is to say, the common mode coil (60) is shown as three coils on the circuit diagram, but is mounted as a single component on a circuit board (20) which will be described later.

The capacitor (12) is connected between positive and negative output nodes of the converter circuit (11), and a direct current (DC) voltage generated at both ends of the capacitor (12) is applied to the input node of the inverter circuit (13). As shown in FIG. 1, the reactor (L) is disposed between the positive output node of the converter circuit (11) and the capacitor (12).

The capacitor (12) of this embodiment is a film capacitor. The capacitor (12) has an electrostatic capacitance capable of smoothing only a ripple voltage (voltage variation) generated when a switching element (which will be described later) of the inverter circuit (13) performs a switching operation. That is, the capacitor (12) is of a small capacity, and has no electrostatic capacitance which smoothes the voltage rectified by the converter circuit (11) (a voltage that varies in accordance with the power source voltage). More specifically, the capacitor (12) and the reactor (L) form a resonant circuit, and its resonant frequency is set, or the electrostatic capacitance of the capacitor (12) and the inductance of the reactor (L) are set, such that a ripple current component included in the direct current outputted from the converter circuit (11) passes through the resonant circuit, and a current component having the same frequency as a carrier signal (carrier frequency) of the inverter circuit (13), which will be described later, is attenuated.

The inverter circuit (13) changes the switching state (on and off states) of a plurality of switching elements (13a) to convert the direct current outputted from the converter circuit (11) to an alternating current, and supply the alternating current to the motor (40). Specifically, as shown in FIG. 1, the inverter circuit (13) includes six switching elements (13a) bridge-connected to each other, and freewheeling diodes (13b) are connected to the respective switching elements (13a). The on and off states of the switching elements (13a) of the inverter circuit (13) are controlled in synchronization with a carrier signal of a predetermined frequency. Specifically, the control unit (14) performs the on and off control of the switching elements (13a).

The control unit (14) includes a microcomputer and a memory device (which may be incorporated in the microcomputer) storing a program for operating the microcomputer. In order to operate the motor (40) in a desired state, the control unit (14) generates a command to the switching elements (13a) (hereinafter referred to as a switching command (G)) and outputs the command to the switching elements (13a). The switching command (G) is a signal for switching each switching element (13a) between the on and off states, and is generated in accordance with, e.g., a deviation between a target rotational speed of the motor (40) and a current rotational speed of the motor (40).

<Mounting of Components on Power Converter>

Figure 2:
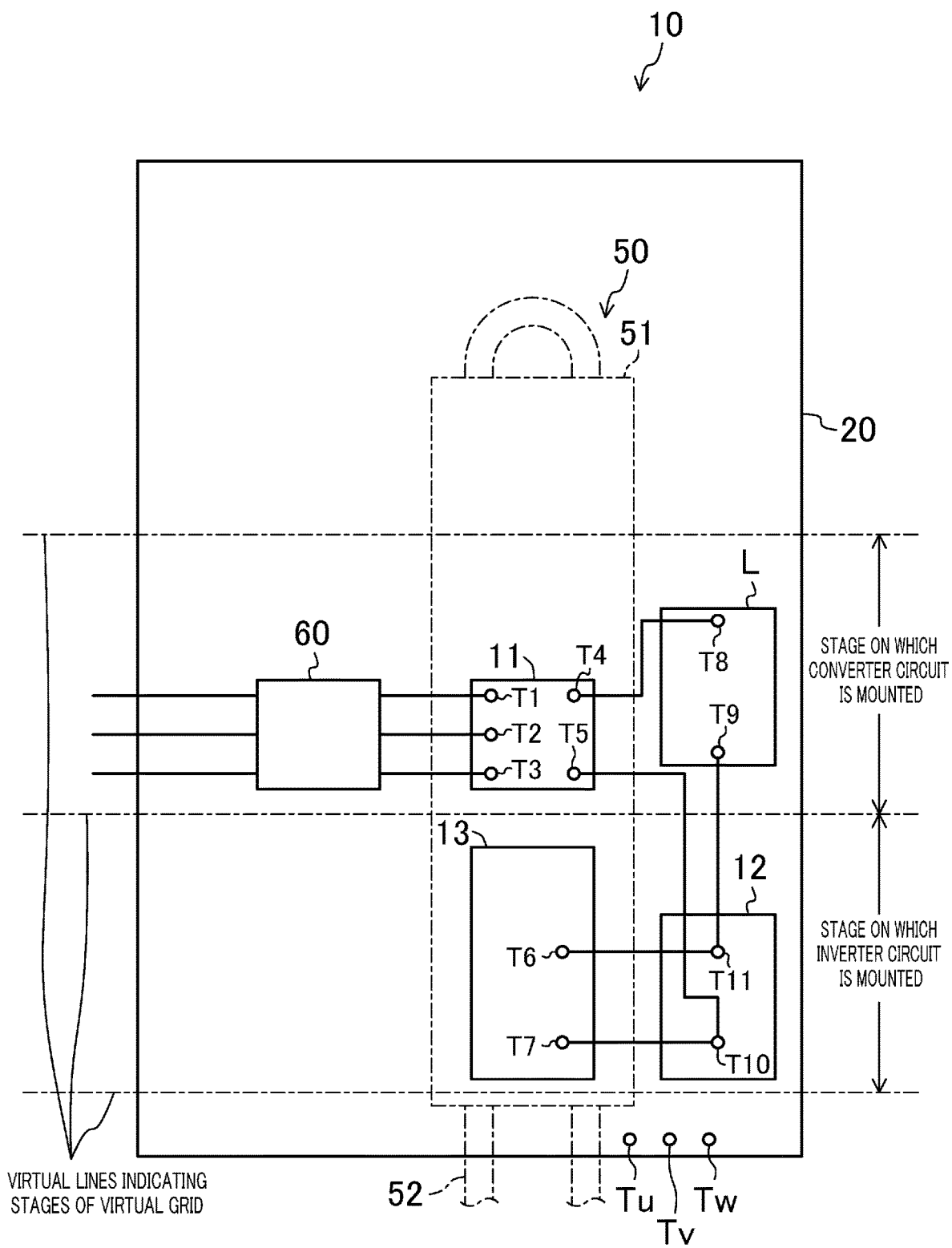
FIG. 2 schematically illustrates how components of the power converter according to an embodiment of the present invention are mounted.

FIG. 2 schematically illustrates how the components of the power converter (10) according to the embodiment are mounted. The power converter (10) uses a four-layer substrate as the circuit substrate (20), on which main components are mounted.

In this embodiment, the diodes (D1 to D6) forming the converter circuit (11) are encapsulated in a single package. The package is provided with three terminals (T1 to T3) receiving the input from the three-phase AC power source (30) and two terminals (T1 and T5) outputting the direct current.

The six switching elements (13a) and six freewheeling diodes (13b) of the inverter circuit (13) are also encapsulated in a single package. In this example, the components of the inverter circuit (13), such as the switching elements (13a), and the converter circuit (11) are encapsulated in different packages. The package encapsulating the inverter circuit (13) has a plurality of terminals for wiring, including terminals (T6, T7) for receiving a direct current.

Moreover, the reactor (L) of this embodiment includes a covered electric wire wound around a toroidal core. Therefore, the reactor (L) according to this embodiment can be made smaller than a reactor formed using a so-called EI core. Note that the reactor (L) can be relatively made small because a capacitor with a relatively small capacity is used as the capacitor (12). Downsizing of the reactor (L) allows the reactor (L) to be easily mounted on the circuit board (20). In this embodiment, as shown in FIG. 2, the capacitor (12) and the reactor (L) are mounted on the same circuit board (20).

Specifically, the converter circuit (11) (package), the capacitor (12), the reactor (L), and the inverter circuit (13) (package) are mounted on the circuit board (20) in a two-stage grid. FIG. 2 shows virtual lines indicating the stages of a virtual grid for convenience of explanation. The converter circuit (11) and the reactor (L) are mounted on the same stage of the grid (see the upper stage of the virtual grid shown in FIG. 2).

The inverter circuit (13) and the capacitor (12) are mounted on a stage different from the stage on which the converter circuit (11) is mounted (see the lower stage of the virtual grid shown in FIG. 2). In the grid, the converter circuit (11) and the inverter circuit (13) are adjacent to each other, and the reactor (L) and the capacitor (12) are adjacent to each other. Further, the common mode coil (60) and the converter circuit (11) are disposed on the same stage of the grid. This can simplify the pattern of traces from the common mode coil (60) to reactor (L) of the circuit board (20).

Regarding the wiring, power source lines for the three phases of the AC power source (30) extend from the left side in FIG. 2, and each of the power source lines is connected to one end of a corresponding one of the three common mode coils (60). The other end of each common mode coil (60) is connected to a corresponding one of the terminals (T1 to T3) of the converter circuit (11) via the traces formed on the circuit board (20). A positive terminal (here, the terminal (T4)) of the converter circuit (11) used for outputting a DC current is connected to one terminal (T8) of the reactor (L) via the trace formed on the circuit board (20). Further, a negative terminal (the terminal (T5)) of the converter circuit (11) used for outputting a DC current is connected to one terminal (T10) of the capacitor (12) via the trace formed on the circuit board (20). The other terminal (T11) of the capacitor (12) is connected to the other terminal (T9) of the reactor (L) via the trace formed on the circuit board (20).

The package including the inverter circuit (13) has terminals (not shown) for outputting the three-phase (U, V, W) alternating current. These terminals are connected to terminals (Tu, Tv, Tw) provided on the circuit board (20) via the traces formed on the circuit board (20). Electric power is supplied to the motor (40) through the terminals (Tu, Tv, Tw) and the motor (40) connected to each other via the wire.

Figure 3:
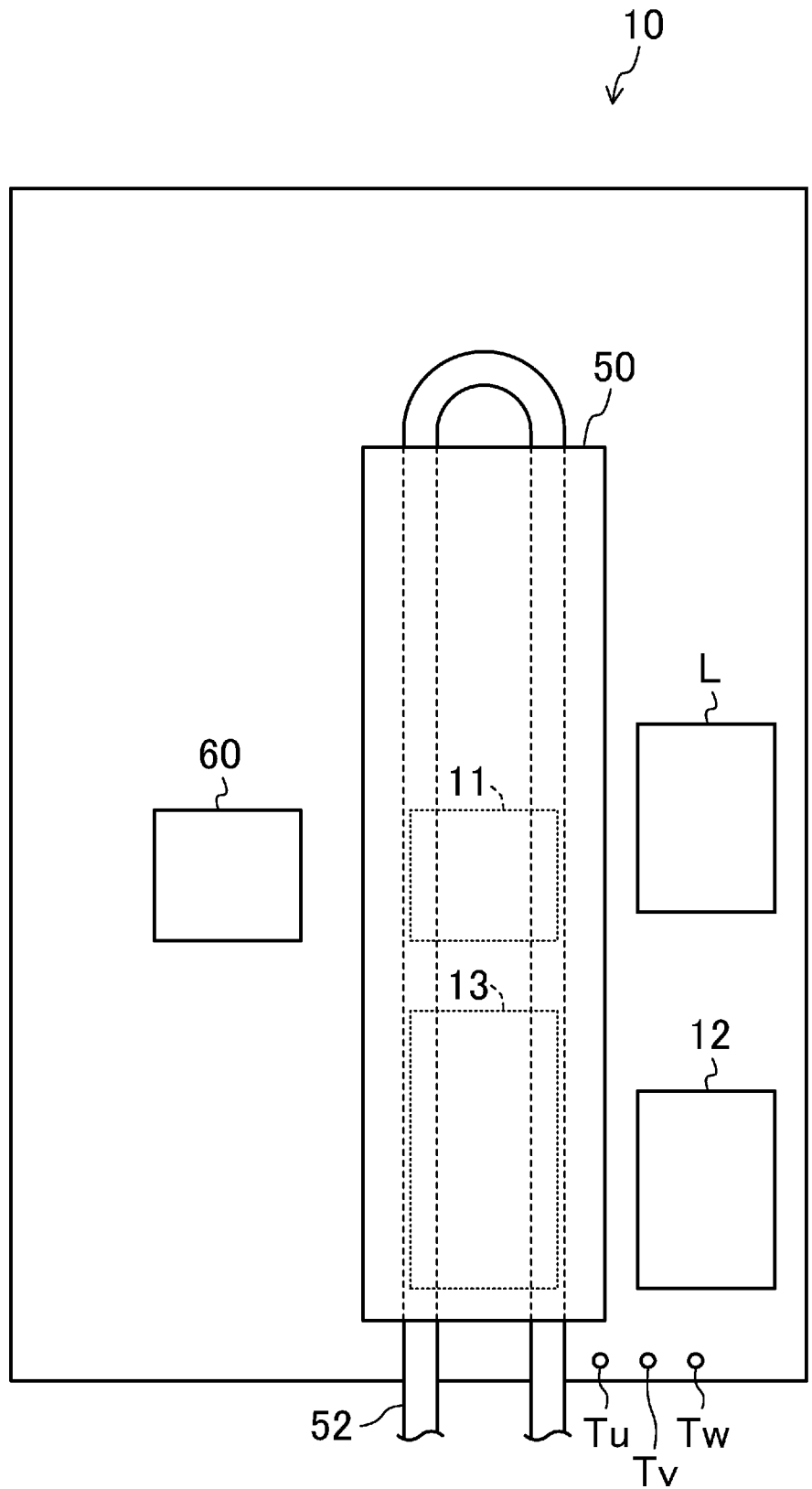
FIG. 3 illustrates an exemplary arrangement for a radiator.

The converter circuit (11) and inverter circuit (13) of the power converter (10) generate heat during operation, and are cooled by the radiator (50). FIG. 3 illustrates an exemplary arrangement for the radiator (50). The radiator (50) includes a body member (51) which makes contact with a cooling object (i.e., the converter circuit (11) and the inverter circuit (13)) and receives heat from the cooling object. The body member (51) is made of metal such as aluminum. A refrigerant pipe (52) through which the refrigerant flows is fixed to the body member (51). The refrigerant pipe (52) forms an integral part of a pipe forming the refrigerant circuit (120) included in the air conditioner (100).

Figure 4:
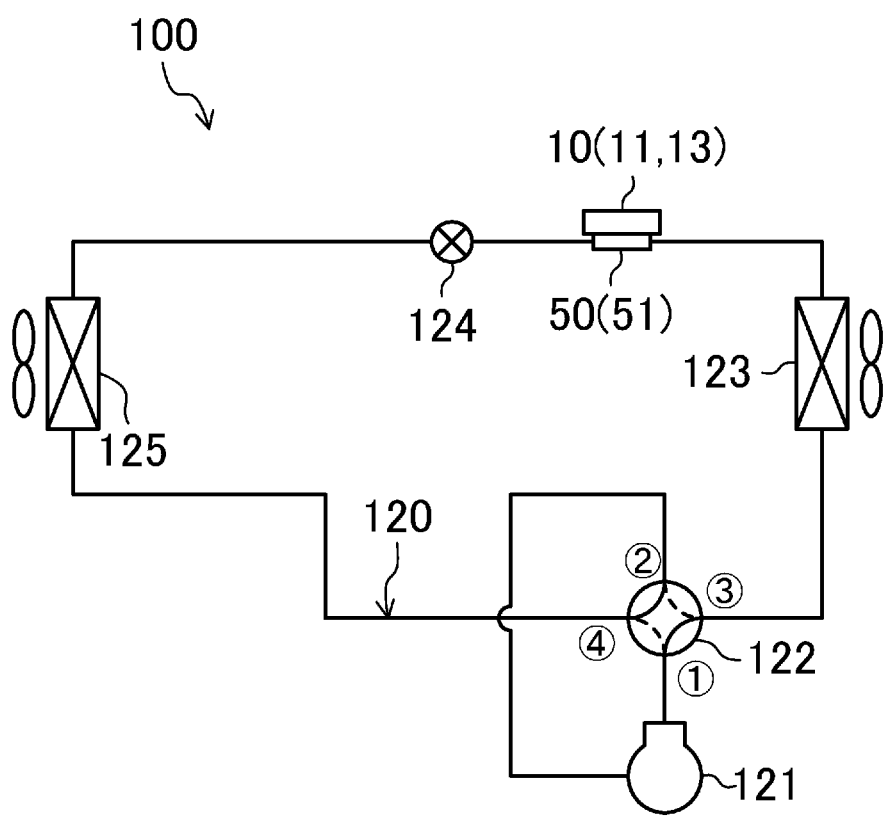
FIG. 4 illustrates an exemplary configuration for a refrigerant circuit.

Here, the refrigerant circuit (120) will be briefly described. FIG. 4 illustrates an exemplary configuration for the refrigerant circuit (120). The refrigerant circuit (120) is a closed circuit filled with a refrigerant, and the refrigerant circulates in the refrigerant circuit (120) to perform a refrigeration cycle. The refrigerant circuit (120) is provided with a compressor (121), a four-way switching valve (122), an outdoor heat exchanger (123), an expansion valve (124), and an indoor heat exchanger (125). Note that the control of the operation of the refrigerant circuit (120) requires a control device, but is not shown in FIG. 4.

Any one of various compressors can be used as the compressor (121). Examples of the compressor (121) include a scroll compressor and a rotary compressor. The outdoor heat exchanger (123) and the indoor heat exchanger (125) are so-called "cross-fin type" heat exchangers. The outdoor heat exchanger (123) exchanges heat between outdoor air and the refrigerant. The indoor heat exchanger (125) exchanges heat between indoor air and the refrigerant. The expansion valve (124) is a so-called "electronic expansion valve."

The four-way switching valve (122) has first to fourth ports. The four-way switching valve (122) is switchable between a first state in which the first port communicates with the third port, and the second port communicates with the fourth port (indicated by solid curves FIG. 4), and a second state in which the first port communicates with the fourth port, and the second port communicates with the third port (indicated by broken curves in FIG. 4).

In the refrigerant circuit (120), the compressor (121) has discharge and suction ports respectively connected to the first and second ports of the four-way switching valve (122). In this refrigerant circuit (120), the outdoor heat exchanger (123), the expansion valve (124), and the indoor heat exchanger (125) are arranged in this order from the third port to fourth port of the four-way switching valve (122). The air conditioner (100) switches the four-way switching valve (122) to switch between a cooling operation and a heating operation. In the refrigerant circuit (120), the refrigerant pipe (52) (see FIG. 4) connecting the outdoor heat exchanger (123) and the expansion valve (124) together is fixed to the body member (51) of the heat radiator (50). That is to say, the body member (51) dissipates heat to the refrigerant flowing between the outdoor heat exchanger (123) and the expansion valve (124).

When the components of the power converter (10) such as the converter circuit (11) are arranged on the circuit board (20) as described above, the converter circuit (11) and the inverter circuit (13) are substantially aligned on the same line (see FIG. 2). Therefore, in this example, as shown in FIG. 3, the body member (51) of the radiator (50) is formed in a rectangular shape when viewed in plan. The body member (51) is disposed to extend across the cooling objects, namely, the converter circuit (11) and the inverter circuit (13). Thus, the radiator (50) is disposed between the common mode coil (60) and the reactor (L).

Advantages of Embodiment

As described above, in this embodiment, the capacitor (12), which has been generally implemented by an electrolytic capacitor, is comprised of a film capacitor, and the capacitor (12) and the reactor (L) are mounted on the same circuit substrate (20). Therefore, countermeasures against noise (the addition of a snubber circuit or a ferrite core), which have been required in the prior art in connecting the reactor outside the circuit board and the circuit board to each other via wiring, is no longer necessary. That is to say, this embodiment can arrange the power converter (10) in a smaller layout area.

The capacitor (12), the reactor (L), and the inverter circuit (13) are mounted on the circuit board (20) in a two-stage grid. This arrangement also contributes to the reduction in the layout area of the power converter (10).

Further, the four-layer substrate used as the circuit board (20) makes it possible to further downsize the circuit board (20).

Other Embodiments

The converter circuit (11) and the inverter circuit (13) may be encapsulated in the same package. Thus, the power converter (10) (circuit board (20)) can be expected to be further downsized.

The fixed position of the radiator (50) in the refrigerant circuit (120) is illustrated as an example. In other words, the refrigerant pipe (52) to be fixed to the body member (51) of the radiator (50) is not limited to the refrigerant pipe connecting the outdoor heat exchanger (123) and the expansion valve (124) together.

The configuration of the radiator (50) is an example. For example, a heat sink for cooling with the air may be used as the radiator (50).

INDUSTRIAL APPLICABILITY

The present invention is useful as a power converter.

DESCRIPTION OF REFERENCE CHARACTERS

10 Power Converter
11 Converter Circuit
12 Capacitor
13 Inverter Circuit
20 Circuit Board
50 Radiator
60 Common Mode Coil (Noise Filter Member)
120 Refrigerant Circuit

The invention claimed is:

1. A power converter comprising:
a converter circuit converting an alternating current to a direct current;
a reactor electrically connected to one of output terminals of the converter circuit;
a capacitor electrically connected to the other output terminal of the converter circuit and the reactor; and
an inverter circuit electrically connected to the capacitor and converts the direct current to an alternating current, wherein:
the capacitor is a film capacitor,
the capacitor and the reactor are adjacent to each other and mounted on a same circuit board,
the converter circuit, the capacitor, the reactor, and the inverter circuit are mounted on said same circuit board in a two-stage grid, said two-stage grid comprising rows and columns,
the converter circuit and the reactor are mounted on a first row of the grid,
the inverter circuit and the capacitor are mounted on a second row different from the first row on which the converter circuit and the reactor are mounted, and
wherein the converter circuit and the inverter circuit are mounted on a first column, and the reactor and the capacitor are mounted on a second column different from the first column on which the converter circuit and the inverter circuit are mounted.

2. The power converter of claim 1, wherein
the capacitor and the reactor form a resonant circuit, whose resonant frequency is set such that a ripple current component included in the direct current outputted from the converter circuit passes through the resonant circuit, and a current component having a same frequency as a carrier frequency of the inverter circuit is attenuated.

3. The power converter of claim 1, further comprising
a radiator which cools the converter circuit and the inverter circuit using a refrigerant flowing through a refrigerant circuit performing a refrigeration cycle.

4. The power converter of claim 1, further comprising:
a radiator which cools the converter circuit and the inverter circuit using a refrigerant flowing through a refrigerant circuit performing a refrigeration cycle; and
a noise filter member disposed to precede the converter circuit, wherein
the radiator is disposed between the noise filter member and the reactor.

* * * * *